United States Patent [19]
Kennedy et al.

[11] Patent Number: 5,921,461
[45] Date of Patent: Jul. 13, 1999

[54] VACUUM PACKAGE HAVING VACUUM-DEPOSITED LOCAL GETTER AND ITS PREPARATION

[75] Inventors: Adam M. Kennedy, Santa Barbara; Charles E. Sarver, Buellton; Ronald L. Williams, Fallbrook, all of Calif.

[73] Assignee: Raytheon Company, Lexington, Mass.

[21] Appl. No.: 08/872,978

[22] Filed: Jun. 11, 1997

[51] Int. Cl.[6] .............................. B23K 31/02; B23K 1/20
[52] U.S. Cl. ..................... 228/124.6; 228/217; 228/221
[58] Field of Search ................................ 228/124.6, 217, 228/221

[56] References Cited

U.S. PATENT DOCUMENTS

| | | | |
|---|---|---|---|
| 5,328,078 | 7/1994 | Okumura | 228/217 |
| 5,729,086 | 3/1998 | Cho et al. | 313/495 |
| 5,734,226 | 3/1998 | Cathey | 313/553 |
| 5,751,107 | 5/1998 | Komatsu | 313/490 |
| 5,789,859 | 8/1998 | Cathey et al. | 313/495 |

FOREIGN PATENT DOCUMENTS

| | | | |
|---|---|---|---|
| 1441560 | 7/1976 | United Kingdom | 228/124.6 |
| 89/04740 | 6/1989 | WIPO | 228/221 |

*Primary Examiner*—Patrick Ryan
*Assistant Examiner*—Jeffrey T. Knapp
*Attorney, Agent, or Firm*—W. C. Schubert; G. H. Lenzen, Jr.

[57] ABSTRACT

A vacuum package (20) is fabricated by providing a package base (22) with a device (32) affixed to the interior of the package base (22), and a package lid (42). An activatable getter material (54) is deposited onto a preselected region of either the interior (48) of the package lid (42) or that portion of the package base (22) which does not have the device (32) affixed thereto. The deposited getter material (54) is deposited at a temperature such that it is activated during deposition. The vacuum package lid (42) is sealed to the vacuum package base (22). The steps of depositing and sealing are conducted in an evacuated vacuum chamber without exposing the interior to atmosphere.

15 Claims, 4 Drawing Sheets

VACUUM PACKAGE HAVING VACUUM-DEPOSITED LOCAL GETTER AND ITS PREPARATION

BACKGROUND OF THE INVENTION

This invention relates to the structure and preparation of a vacuum package containing a microelectronic or sensor device, and, more particularly, to such a package having a locally deposited internal getter.

In the past, infrared sensors have required cooling to cryogenic temperatures on the order of 50–80° K to be operable. New sensors that operate at higher temperatures, and even at room temperature, have recently been developed. Like the cryogenically cooled sensors, the higher-temperature infrared sensors are sealed in a vacuum for operation, to prevent contamination or degradation of the active elements, and to provide thermal insulation from the ambient environment. These sensors are frequently less sensitive than those operating at cryogenic temperatures, but they have the advantage of not requiring a cryogenic cooling device. Consequently, they may be made smaller in size and less expensive than cryogenically cooled sensors.

In a typical application under development, an array of 320×240 sensor elements is formed on a substrate. Each sensor element is from about 10–50 micrometers by 10–50 micrometers in size. The array is sealed into a package whose interior is evacuated, with external leads extending from the array. Because no cooling is required, the package may be made small, on the order of ½–1 inch×½–1 inch× 0.06 inch thick, and the packaged device is significantly simplified as compared with a cryogenically cooled sensor and its package.

The interior of the package must remain evacuated and at low pressure. To accomplish this end, getter material is placed inside the vacuum package and activated, effectively forming a chemical vacuum pump. A getter is a material that, when activated, captures gas molecules in a vacuum. The getter absorbs, adsorbs, and/or physically entraps oxygen and other molecules that are outgassed from the array structure over the life of the product.

In most conventional sensor vacuum packages, the getter is placed into a metal tube that is welded to the side of the vacuum package and then heated to activate the getter. In another approach, the getter is attached inside the package to electrical wires extending through electrical feedthroughs, and an electrical current is passed through the wires to heat the getter material and activate it. These approaches are not feasible for the very small vacuum packages now possible with the room-temperature infrared sensors. There is therefore a need for a design and a technique for implementing that design to provide effective gettering inside a small vacuum package. The need is particularly acute for the room-temperature infrared sensor system discussed above, but is also present for a number of other types of vacuum-packaged devices. The present invention fulfills this need, and further provides related advantages.

SUMMARY OF THE INVENTION

The present invention provides a gettered vacuum package and a method for its fabrication. The approach is operable regardless of the size of the vacuum package, but it yields its greatest benefits when used with very small vacuum packages. The getter is precisely positioned and structured for maximum effectiveness, without adversely affecting the operation of the device in the vacuum. An important advantage is that the approach for providing the getter and its activation is fully compatible with the fabrication of sensors and microelectronic devices in the interior of the vacuum package.

In accordance with the invention, a vacuum package comprises a package base having a package base interior, a device affixed to a first portion of the package base interior, and a package lid having a package lid interior. There is no device affixed to a second portion of the package base interior. The package lid is sealed to the package base. An activated getter material is present on a preselected region of at least one of the second portion of the package base interior and the package lid interior. There is no evacuation port on either the package base or the package lid.

In another embodiment, a method for fabricating a vacuum package comprises the steps of providing in an evacuated vacuum chamber a package base having a package base interior and a device affixed to a first portion of the package base interior, wherein there is no device affixed to a second portion of the package base interior, and providing in the evacuated vacuum chamber a package lid having a package lid interior. An activatable getter material is deposited onto a preselected region of at least one of the second portion of the package base interior and the package lid interior. The deposited getter material is deposited at a temperature such that it is activated during deposition, with the step of depositing being conducted in the evacuated vacuum chamber. In one approach, the getter is deposited through the open portion of a mask that shields the remainder of the package interior from getter deposition. The method further includes sealing the vacuum package lid to the vacuum package base, with the step of sealing being conducted in the evacuated vacuum chamber.

In an embodiment of particular interest, the device is a room-temperature infrared sensor, and the package lid has a window therein made of an infrared-transparent material. The getter material is deposited onto that portion of the package lid not facing the sensor, and/or onto that laterally adjacent portion of the package base not occupied by the sensor.

The morphology of the getter is controlled to some extent by the deposition rate. A slow deposition produces a nodular structure with a higher surface area than that of a flat structure resulting from relatively faster deposition.

The present invention is most advantageously employed with small-size vacuum packages for which it is extremely difficult or impossible to supply activated getter material by conventional approaches, but it is not so limited.

Other features and advantages of the present invention will be apparent from the following more detailed description of the preferred embodiment, taken in conjunction with the accompanying drawings, which illustrate, by way of example, the principles of the invention. The scope of the invention is not, however, limited to this preferred embodiment.

DETAILED DESCRIPTION OF THE INVENTION

Figure 1:
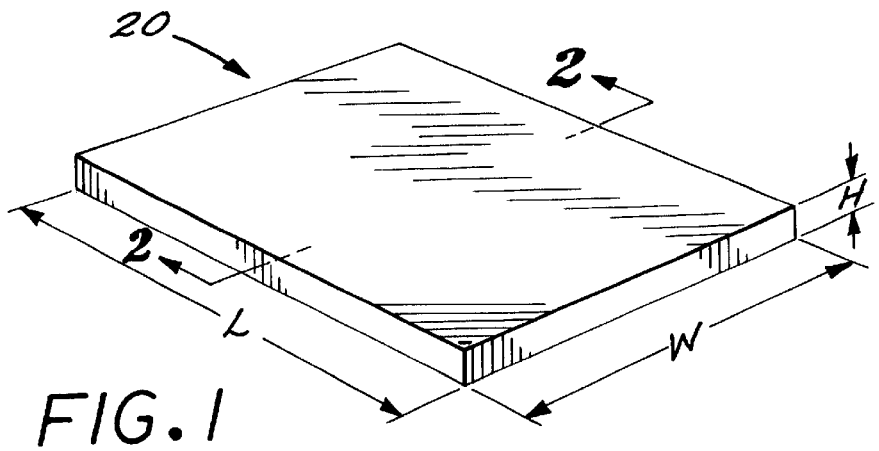
FIG. 1 is a perspective view of a vacuum package structure for a room-temperature infrared sensor.

FIG. 1 illustrates a vacuum package 20 enclosing a room-temperature infrared sensor, the preferred application of the present invention. The vacuum package has a length L, a width W, and a height H. In the preferred embodiment, L and W are about the same, and each equal to about ½–1 inch (depending upon the size of the sensor array), and H is about 0.062 inch. (The total height H includes a focal plane array about 0.020 inch thick, a lid/window about 0.040 inch thick, and a vacuum space therebetween of about 0.002 inch, see FIG. 2.) This vacuum package 20 is so small that there is no room for a tubular getter receiver appended to the vacuum package or an electrically activated getter in the vacuum space, nor is there room for an evacuation line through which the interior of the vacuum package 20 is evacuated and thereafter sealed.

Figure 2:
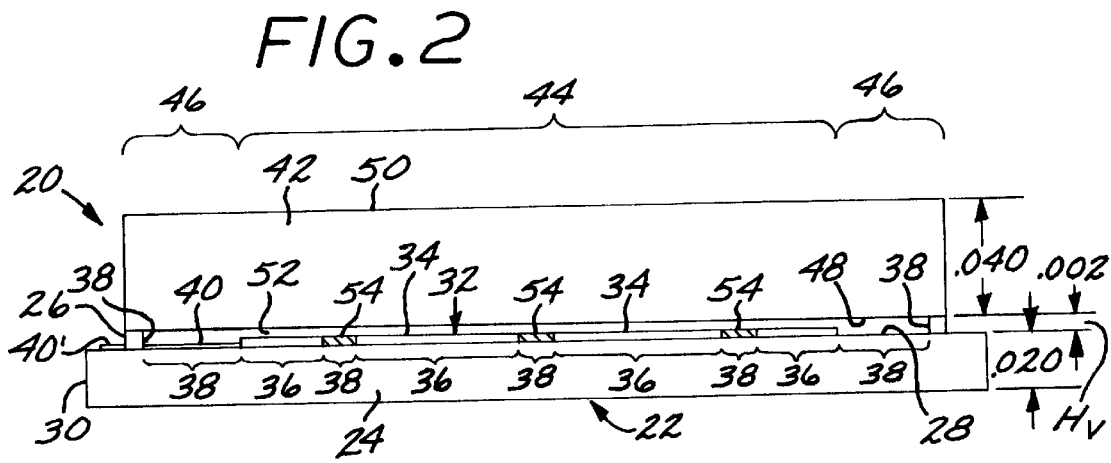
FIG. 2 is a schematic sectional view of the vacuum package structure of FIG. 1, taken on line 2—2.

FIG. 2 is a schematic (not to scale) sectional view of the vacuum package 20, showing its interior structure. A package base 22 includes a generally planar, flat substrate 24 that forms the bottom of the vacuum package 20, and a sidewall 26 extending upwardly from the substrate 24. The package base may incorporate the readout integrated circuit (ROIC) function and is preferably made of silicon but may alternatively be made of a ceramic material such as aluminum oxide. The illustrated embodiment shows the sidewall 26 as a separate element from the substrate 24, which is joined to the substrate by a vacuum-tight means such as a hybridization seal. In hybridization, two articles to be joined and sealed are aligned and contacted together, under pressure and heating, with a sealing element surface, typically made of a metal such as indium, therebetween. In hybridization, an entire article may be made of the sealing material, there may be a separate sealing element placed between the articles, or one or more of the article surfaces to be sealed may be coated with the sealing material. The application of force to the articles and through the sealing material at elevated temperature causes the sealing material to form a joint and hermetic seal between the articles. Equivalently for the present purposes, the sidewall and the substrate may be fabricated integrally as a single element. In either case, there is a package base interior 28 and a package base exterior 30.

A device, here an infrared light sensor 32, is affixed to the substrate 24. The device is preferably fabricated as a focal plane array of discrete sensor elements 34. In a preferred light sensor, each sensor element is about 10–50 micrometers×10–50 micrometers in size, most preferably about 48 micrometers×48 micrometers in size. The array is formed as a 320×240 array of such sensor elements, but this size may be varied as desired for particular applications. In such a light sensor and array, there is a first portion 36 of the package base interior 28 that is overlaid by the sensor elements 34, and a second portion 36 of the package base interior 28 that is not overlaid by the sensor elements 34. Electrical signal traces 40 extend from the light sensor 32 to external bonding pads 40' on the base 22. The light sensor 32 is designed to be operable at room temperature. The material and construction of the light sensor are known in the art and are described, for example, in W. A. Radford et al., "320×240 silicon microbolometer uncooled IR FPAs with on-chip offset correction", in *Infrared Detectors and Focal Plane Arrays IV,* Eustace L. Dereniak et al., eds., Proceedings SPIE, Vol. 2746, page 82, 1996.

A vacuum package lid 42 is sealed to the sidewalls 26, as by hybridization. The lid 42 is made of a material appropriate to the functioning of the device. For the preferred case, the lid 42 is made of a material that is transparent to infrared radiation, such as germanium. However, because the light sensor 32 does not cover the entire substrate, there is a first portion 44 of the lid 42 that is in facing relation to the light sensor 32 and serves as a window for the light sensor, and a second portion 46 that does not lie in facing relation to the light sensor and therefore does not serve as a window. Equivalently for the present purposes, the lid could be made of two different materials, an infrared-transparent material in the first portion and a non-transparent material in the second portion. Using a single material is typically less costly, however. The lid 42 has an vacuum package lid interior 48 and a vacuum package lid exterior 50. The volume bounded by the interior walls 28 and 48, and the sidewalls 26, the interior 52 of the package, is evacuated. The vacuum space clearance $H_V$ of the vacuum space in the interior 52 between the package base interior 28 and the lid interior 50, measured in the direction perpendicular to the plane of the substrate 24, is indicated in FIG. 2 to be about 0.002 inches. The present invention is preferably employed where $H_V$ is about 0.100 inches or less, inasmuch as it is extremely difficult to attach a separate getter tube for vacuum space thicknesses in this range.

At least some of the interior sides of the second portions 38 and 46 have an activated getter material 54 deposited thereon in preselected regions. In FIG. 2, the activated getter material is deposited on part of the second portion 38 of the package base, between the individual sensor elements 34 of the light sensor 32. Other regions of the second portions 38 and 46 may additionally or instead have the activated getter material 54 deposited thereon, and the manner of preselection and other locations at which the getter material may be placed will be discussed subsequently.

Figure 3:
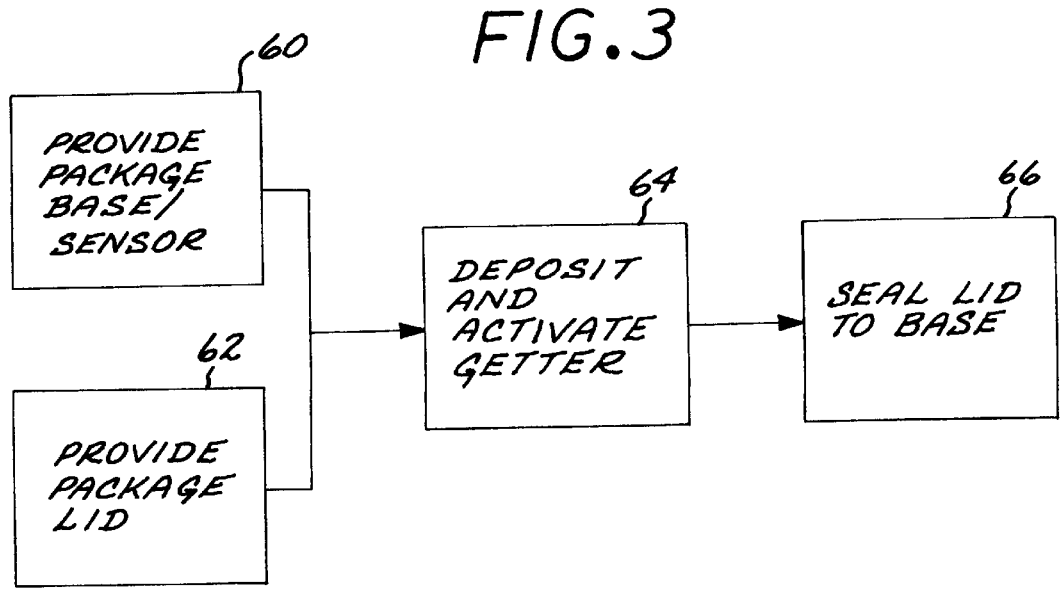
FIG. 3 is a block diagram of a method for preparing the vacuum package structure.

FIG. 3 illustrates in block diagram form the fabrication process for the vacuum package 20. The package base 22, with the light sensor 32 already affixed thereto, is provided, numeral 60. In the preferred approach, the light sensor 32 is formed by deposition techniques directly onto the substrate 24. This deposition must necessarily precede the getter deposition and activation step 64, because deposition of the light sensor requires exposure to air. Such exposure, if accomplished after the getter material is activated, would immediately saturate it and render it useless for further functioning unless reactivated. Reactivation is difficult, as it could lead to damage of the sensor element.

The package lid 42 is provided, numeral 62. A getter material is deposited upon at least some preselected regions of the second interior portions 38 and 46. Although FIG. 3 might be interpreted to suggest that getter material must be deposited on both the package base and the package lid, that is not the case. The activated getter material may be deposited on regions of the second portion 38 and not the second portion 46, regions of the second portion 46 and not the second portion 38, or on both the second portion 38 and the second portion 46. After deposition and activation of the getter material, the package lid 42 is sealed to the package base 22. The steps 64 and 66 are performed in a vacuum without contacting the partially completed vacuum package to air after steps 60 and 62, and before the completion of step 66. The manufacture of the package base/sensor and package lid typically require exposure to the atmosphere at one or more steps, but thereafter they are placed into an evacuated environment to complete steps 64 and 66.

Figure 4:
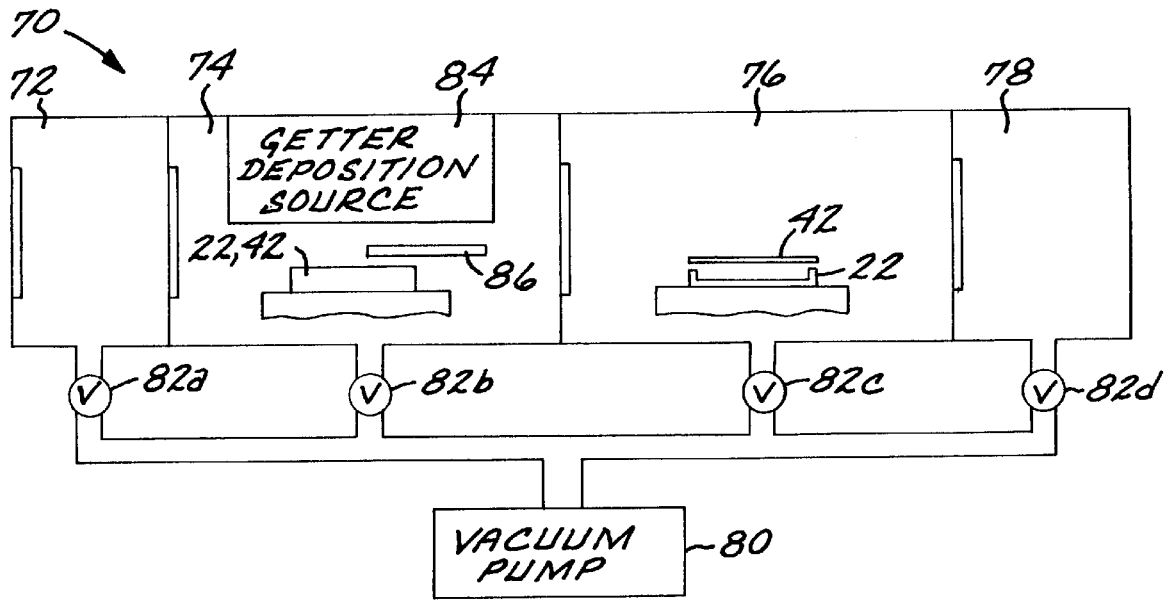
FIG. 4 is a schematic view of an apparatus for preparing the vacuum package structure.

FIG. 4 illustrates a vacuum apparatus 70 suitable for fabrication of the vacuum package 20. The apparatus has an entry airlock 72, a deposition working chamber 74, an assembly working chamber 76, and an exit airlock 78. The four volumes 72, 74, 76, and 78 are evacuated through manifolding by a suitable vacuum pump 80 operating through valves 82a, 82b, 82c, and 82d. The vacuum pump 80 preferably includes a roughing pump and a high vacuum pump such as a cryopump, a molecular drag pump, or a turbopump, so that the interior of the volumes 72, 74, 76, and 78 may each be evacuated to a vacuum of less than $10^{-6}$ Torr. Articles may be inserted into the entry airlock 72, and thereafter moved to the chambers 74 and 76, and to the exit airlock 78, without exposing them to the atmosphere.

In the deposition working chamber 74, the getter material 54 is deposited and activated. The getter material 54 may be any operable getter material for capturing and holding gases that may leak into the final closed vacuum package or may be outgassed from the interior walls of the vacuum package or from the device. Such gaseous species typically include oxygen, nitrogen, hydrogen, carbon monoxide, carbon dioxide, methane, and other organic species. The preferred getter materials are titanium, molybdenum, barium, or tantalum. The most effective getter is tantalum, which captures hydrogen and carbon monoxide twice as fast as titanium and molybdenum. However, tantalum may be difficult to deposit due to the required high deposition temperatures, so titanium and molybdenum are more preferred. Of these, titanium is most preferred.

The getter material 54 is deposited from a getter deposition source 84 suitable for the selected getter material and the required energy of deposition. Preferred deposition sources are a sputtering source for high-energy deposition and electron beam and thermal evaporation sources for low-energy deposition. The significance of high-energy and low-energy deposition will be discussed subsequently.

The getter material is deposited only in preselected regions of the interiors 28 and 48, and specifically in at least some part of the second portions 38 and 46. Getter material may not be deposited in the first portion 36 of the package base because it would obscure the face of the light sensor 32 and may not be deposited in the first portion 44 of the lid because it would obscure the window portion of the lid. Deposition in preselected regions may be accomplished in any operable manner. Preferably, a mask 86 is placed over the article upon which getter material is to be deposited (either the package base 22 or the package lid 42 or both), in the line of flight of the getter material from the source 84. The mask has solid areas that block the passage of the atoms of the getter material and open areas that permit the passage of the atoms. The mask 86 may be a separate piece as shown in FIG. 4 or it may be deposited onto the surface of the article. The use of a separate piece is preferred, because the deposition generates considerable heat that is used to advantage in activation of the getter material, but could conceivably damage the sensor 32 in the regions where no getter material is to be deposited.

The preferred getter materials require activation. That is, they must be heated to a sufficiently high elevated temperature to cause them to desorb chemical species attached to them so that they are operable to capture gas molecules. In the present approach, the getter material is activated in situ by the deposition process. The atoms of getter material are evaporated or otherwise ejected from the source 84. The trajectories of some of the atoms from the source 84 travel to and deposit upon the deposition regions 38 and/or 46. The atom of getter material, as it is deposited upon the regions 38 and/or 46, is in an activated state because it has been ejected from the source in the vacuum environment and has not had the opportunity to chemically react with any other species. It is thereby activated in situ, and no further activation is required.

After the getter material is deposited and activated, the components are moved to the assembly working chamber 76. The package lid 42 is affixed to the sidewall 26 of the package base 22 by a technique that produces a vacuum-tight seal as well as a mechanical bond. The preferred approach is indium hybridization. The package interior 52 is sealed at the vacuum of the interior of the assembly working chamber 76, without ever exposing the deposited and activated getter material to the atmosphere.

Figure 5:
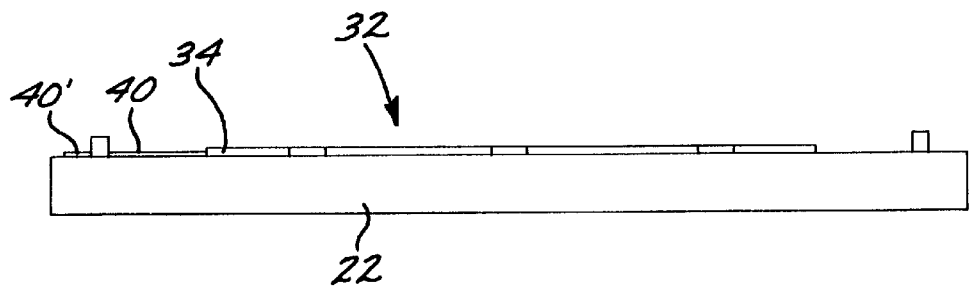
FIG. 5 is a sectional view like that of FIG. 2 but at a stage of fabrication prior to deposition of the getter material.
Figure 6:
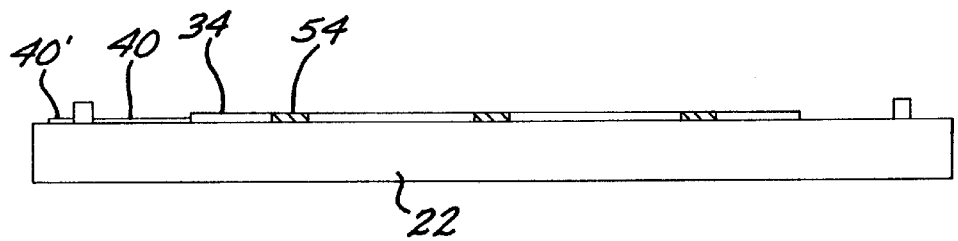
FIG. 6 is a sectional view like that of FIG. 5 but at a stage of fabrication after deposition of the getter material.

FIG. 5 shows the structure of the vacuum package base 22 and attached light sensor 32 prior to deposition of the getter material in step 64. FIG. 6 shows this same structure after completion of step 64. FIG. 2 illustrates the same structure after completion of step 66.

Figure 7:
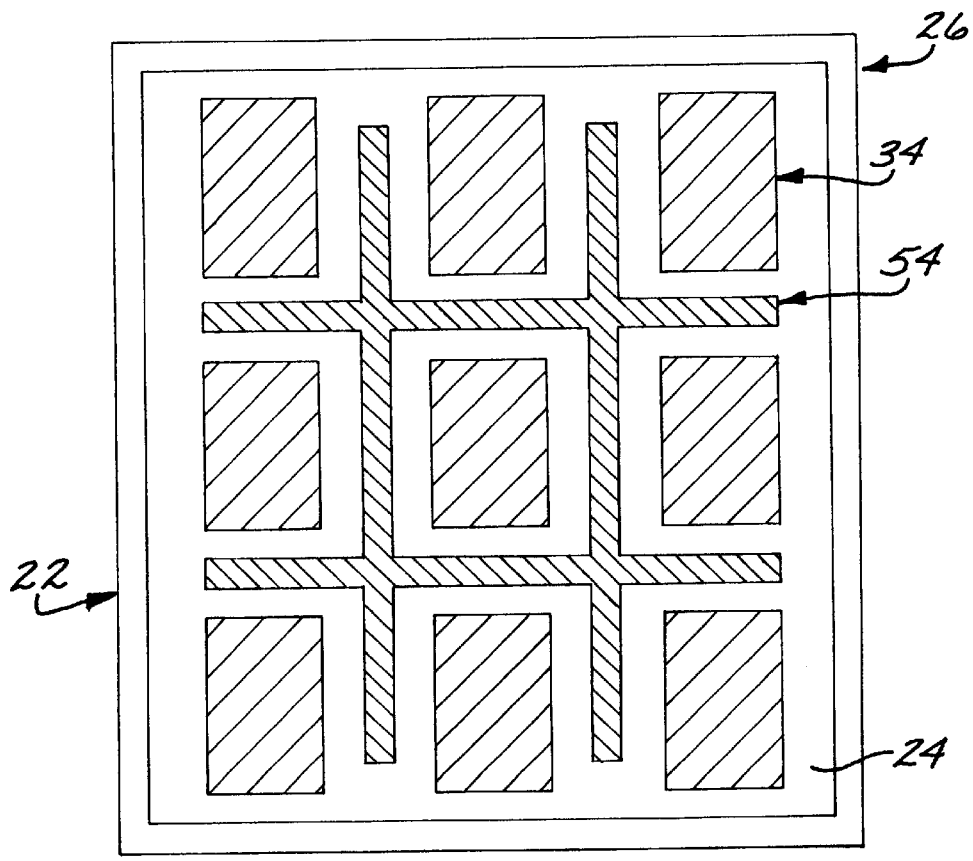
FIG. 7 is a plan view of the upper surface of the package base and sensor showing a first positioning for the getter material.
Figure 8:
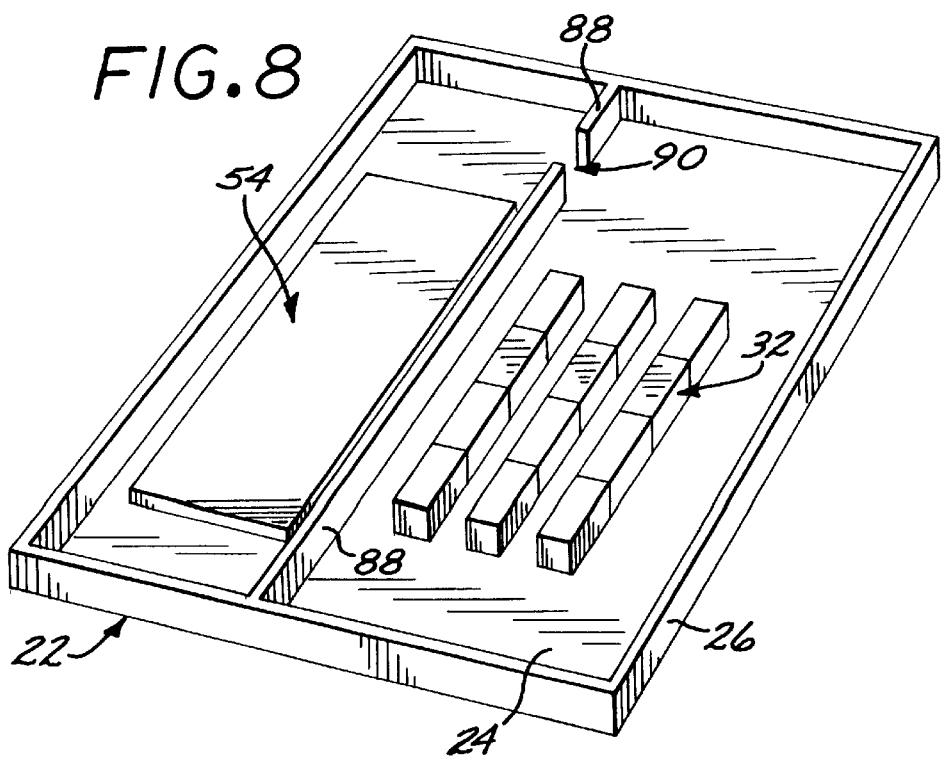
FIG. 8 is a perspective view of the upper surface of the package base and sensor showing a second positioning for the getter material.
Figure 9:
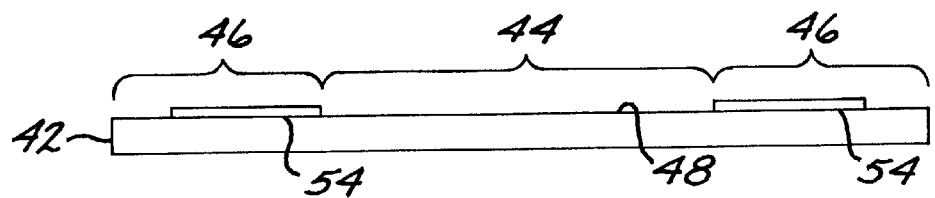
FIG. 9 is an elevational view of the interior surface of the package lid showing a third positioning for the getter material.

The location of the getter material is preselected according to its desired functionality and the functionality of the device within the vacuum package. FIGS. 7–9 illustrate three examples of the preselected locations for placement of the getter material within the interior of the vacuum package. In the approaches of FIGS. 7 and 8, the getter material is deposited in selected regions of the second portion 38 of the package base 22.

The approach of FIG. 7 is that depicted in FIG. 2, where the getter material lies between the sensor elements 34 that form the light sensor array 32. This configuration places the getter material in the closest possible proximity with one of the sources of outgassing, the sensor elements themselves. The disadvantage of this approach is that the mask is relatively complex and must be very precisely aligned with the sensor elements 34 to avoid contamination of the sensor elements as the getter material is deposited.

FIG. 8 shows another approach for depositing the getter material onto the package base 22. An interior wall 88 with an opening 90 therethrough is provided to separate the region of the light sensor 32 from a region where the getter material is to be placed. In this case, the mask generally covers the entire region of the substrate to the right of the interior wall 88, where the light sensor 32 resides, and the mask may even have a downwardly extending portion to block the opening 90. This mask is much simpler in construction and easier to align than the mask used for the embodiment of FIG. 7. The approach of FIG. 7 is more favorably employed when the sensor elements are relatively well spaced from each other and/or the package base is far from the source during deposition, and the approach of FIG. 8 is more favorably employed when the sensor elements are closely spaced and/or the package base is close to the source during deposition.

Figure 10:
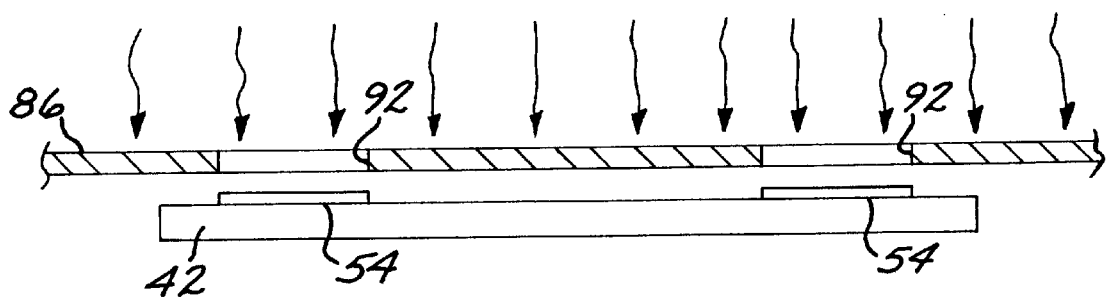
FIG. 10 is an elevational view of the package lid with a mask used in getter material deposition.

In another approach shown in FIGS. 9 and 10, the getter material 54 is deposited on the interior 48 of the second portion 46 of the lid 42, the portion of the lid 42 not in a facing relation with the light sensor 32. FIG. 9 depicts the final lid (in the orientation for deposition in FIG. 4, but inverted from the orientation relative to the base in FIG. 2), and FIG. 10 depicts the lid 42 and mask 86 during deposition of the getter material through openings 92 in the mask. The approach of FIGS. 9 and 10 also utilizes a relatively simple mask and permits somewhat imprecise alignment of the mask, and also does not risk contamination of the light sensors 32.

Of these approaches illustrated in FIGS. 7–9, the deposition of the getter on the inside of the lid 42 as in FIG. 9 is preferred, because there is no risk of contamination of the sensor 34 by the getter material. The deposition of the getter into the interior of the package base, as in FIGS. 8, would be used to provide additional gettering capacity, if it is determined that the getter in the lid provides insufficient pumping capacity. The approach of FIG. 7, which requires deposition of the getter material quite close to the sensors, would normally be used only as a last resort due to the risk of contamination of the sensor elements.

Figure 11:
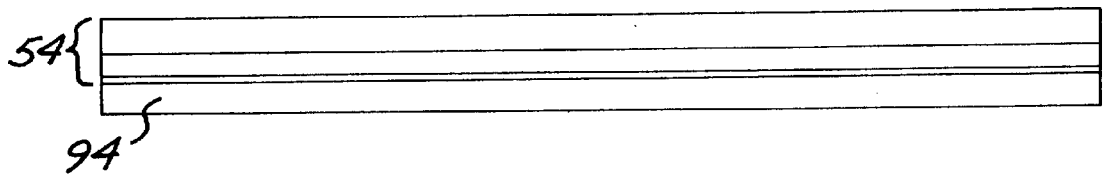
FIG. 11 is an elevational view of a substrate with layers of getter material deposited at a relatively high rate.

The morphology of the deposit of getter material 54 onto an underlying material 94 may be controlled to vary the gettering capability. If a relatively high rate, high-energy deposition is performed, as by a sputtering getter deposition source 84, the morphology tends to be flat, as shown in FIG. 11.

Figure 12:
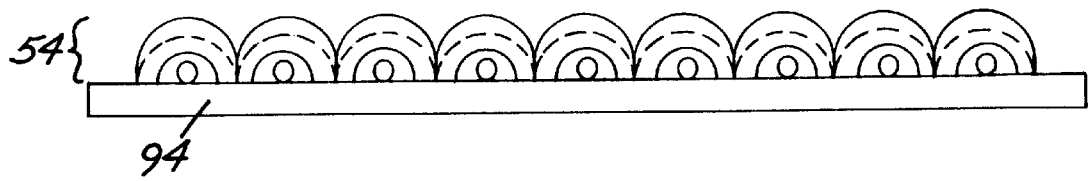
FIG. 12 is an elevational view of a substrate with layers of getter material deposited at a relatively low rate.

If a relatively low rate, low-energy deposition is performed, as by an electron beam or thermal evaporation getter deposition source 84, the deposit is more nodular or agglomerated in form, as shown in FIG. 12. The nodular form in FIG. 12 has higher surface area for gettering, but is slower to deposit. The rough, nodular form of getter surface may also serve to physically entrap gas molecules, improving the efficiency of the gettering. Other techniques such as retarding voltages may be used where appropriate, as where the getter material is deposited as an ion.

Although several particular embodiments of the invention have been described in detail for purposes of illustration, various additional modifications and enhancements may be made without departing from the spirit and scope of the invention. Accordingly, the invention is not to be limited except as by the appended claims.

What is claimed is:

1. A method for fabricating a vacuum package, comprising the steps of:
   providing a package base having a package base interior and a light sensor device affixed to a first portion of the package base interior, wherein there is no device affixed to a second portion of the package base interior
   providing a package lid having a package lid interior, a window therethrough transparent to light of a wavelength to which the light sensor device is sensitive, and a second portion of the package lid interior which is not a part of the window;
   depositing an activatable getter material onto a preselected region of at least one of the second portion of the package base interior and the second portion of the package lid interior, the deposited getter material being deposited at a temperature such that it is activated during deposition; and
   sealing the vacuum package lid to the vacuum package base,
   wherein the steps of providing a package base, providing a package lid, depositing, and sealing are performed in an evacuated chamber without exposure to atmosphere.

2. The method of claim 1, wherein the steps of providing a package base and providing a package lid include the step of
   providing a vacuum space clearance between the package base interior and the package lid interior of no more than about 0.100 inch.

3. The method of claim 1, wherein the step of depositing includes the step of
   depositing the activatable getter material through an open region of a mask.

4. The method of claim 1, wherein the step of depositing includes the step of
   depositing the activatable getter material at a deposition rate such that the surface structure of the getter material is nodular.

5. The method of claim 1, wherein the step of depositing includes the step of
   depositing the getter material onto a preselected region of the window.

6. The method of claim 1, wherein the step of depositing includes the step of
   depositing the getter material onto a preselected region of the second portion of the package base interior laterally adjacent to the light sensor device.

7. A method for fabricating a vacuum package, comprising the steps of:
   providing in an evacuated vacuum chamber a package base having a package base interior and a device affixed to a first portion of the package base interior, wherein there is no device affixed to a second portion of the package base interior;
   providing in the evacuated vacuum chamber a package lid having a package lid interior, there being a vacuum space clearance between an interior of the package base and an interior of the package lid;
   depositing an activatable getter material onto a preselected region of at least one of the second portion of the package base interior and the package lid interior, the deposited getter material being deposited at a temperature such that it is activated during deposition, the step of depositing being conducted in the evacuated vacuum chamber; and
   sealing the vacuum package lid to the vacuum package base, the step of sealing being conducted in the evacuated vacuum chamber.

8. The method of claim 7, wherein the step of depositing includes the step of
   depositing the activatable getter material on the preselected region of the second portion of the package base interior.

9. The method of claim 7, wherein the step of depositing includes the step of
   depositing the activatable getter material on the preselected region of the package lid interior.

10. The method of claim 7, wherein the steps of providing a package base and providing a package lid include the step of providing a vacuum space clearance of no more than about 0.100 inch.

11. The method of claim 7, wherein the step of depositing includes the step of depositing the activatable getter material through an open region of a mask.

12. The method of claim 7, wherein the step of depositing includes the step of depositing the activatable getter material at a deposition rate such that the surface structure of the getter material is nodular.

13. The method of claim 7, wherein the step of providing in an evacuated vacuum chamber a package base includes the step of providing a light sensor device affixed to the first portion of the package base interior, and wherein the step of providing in the evacuated vacuum chamber a package lid includes the step of providing a package lid comprising a window therethrough transparent to light of a wavelength to which the light sensor device is sensitive.

14. The method of claim 13, wherein the step of depositing includes the step of depositing the getter material on to a preselected region of the window.

15. The method of claim 13, wherein the step of depositing includes the step of depositing the getter material onto a preselected region of the second portion of the package base interior laterally adjacent to the light sensor device.

* * * * *